United States Patent [19]

Keaton

[11] Patent Number: 4,938,997
[45] Date of Patent: Jul. 3, 1990

[54] PROCESS FOR MAKING HYBRID MICROCIRCUITS PROVIDING ACCURATE THICK FILM RESISTOR PRINTING

[75] Inventor: William R. Keaton, Genoa, Ill.

[73] Assignee: AG Communication Systems Corporation, Phoenix, Ariz.

[21] Appl. No.: 345,805

[22] Filed: May 1, 1989

[51] Int. Cl.$^5$ .............................................. H01C 17/06
[52] U.S. Cl. ...................................... 427/103; 29/620; 338/308; 338/309
[58] Field of Search ................... 29/613, 620; 427/101, 427/102, 103; 338/308, 309

[56] References Cited

U.S. PATENT DOCUMENTS

| | | | |
|---|---|---|---|
| 3,669,733 | 6/1972 | Allington | 29/620 |
| 3,787,965 | 1/1974 | Cocca et al. | 29/620 |
| 4,796,356 | 1/1989 | Ozaki | 29/613 |

Primary Examiner—P. W. Echols
Attorney, Agent, or Firm—Anthony Miologos

[57] ABSTRACT

An improved process for fabricating thick film hybrid microcircuits that produces thick film resistors having electrical characteristics consistent with the microcircuit design tolerances, in areas proximate a dielectric build-up. The process includes, establishing by printing and firing a plurality of first conductor traces including the cross-under conductors to a substrate. Next, the resistive elements are printed and fired on the substrate and a dielectric glaze printed and fired over the resistive elements. At least one dielectric layer is then printed and fired over the cross-under conductors. A plurality of second conductor traces are next printed and fired on the substrate, including the cross-over conductors which are printed over the dielectric layer. Finally, a dielectric glaze is printed and fired over the cross-over conductors.

4 Claims, 1 Drawing Sheet

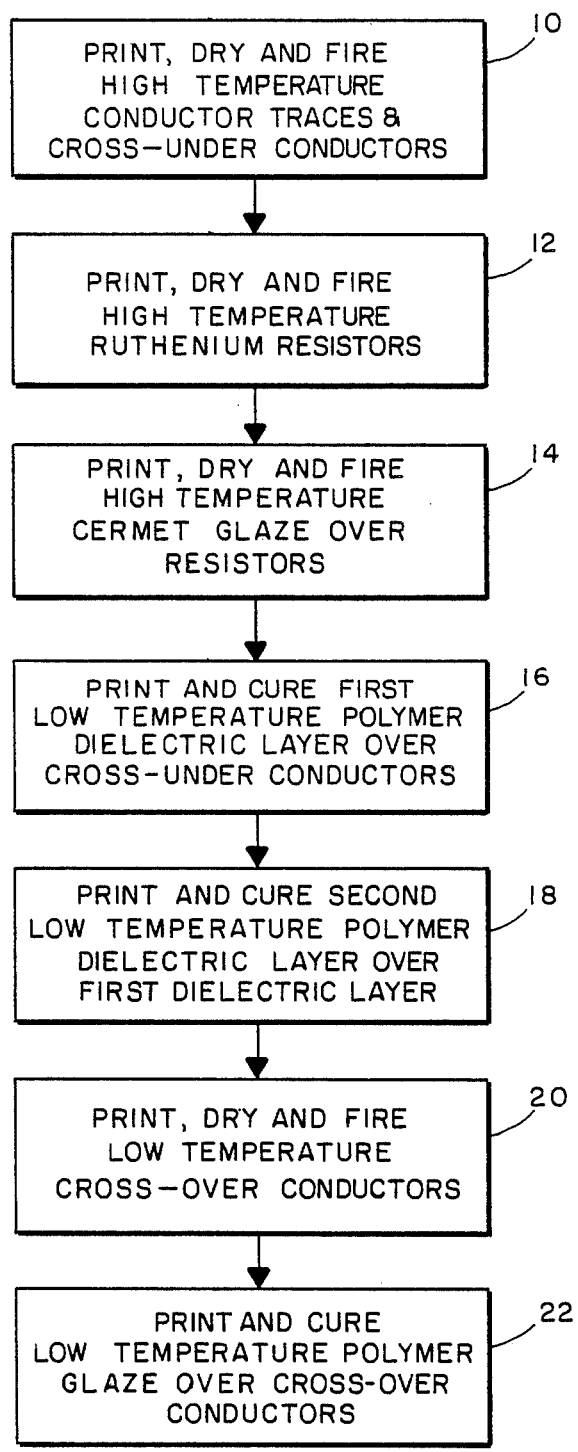

PROCESS FOR MAKING HYBRID MICROCIRCUITS PROVIDING ACCURATE THICK FILM RESISTOR PRINTING

Cross reference is made to the following related Application entitled: "A Process For Making Hybrid Microcircuits Providing Accurate Thick Film Resistor Printing", (Ser. No. 345,806), filed on the same date as the instant Application, and having a common inventor and assignee.

FIELD OF THE INVENTION

The present invention relates to the field of thick film hybrid microcircuits and, more particularly, to a new and improved process of fabricating thick film hybrid microcircuits which provide for accurate and consistent thick film resistor printing.

BACKGROUND OF THE INVENTION

Present methods utilized in the manufacture of thick film hybrid microcircuits include a multi-stepped process which builds the hybrid microcircuits in layers on a substrate. Microcircuit components, such as conductors and dielectric layers are normally screen printed, fired, or cured prior to the printing and firing of the resistor layers. This is normally due to the relatively low temperature firing requirements of the conductor and dielectric layers.

Additionally, many hybrid microcircuit designs require the crossing of two or more conductors. In this situation a first conductor, or cross-under conductor, is deposited on the substrate and one or more layers of a dielectric material is printed over the cross-under conductor at the point where a second conductor, or cross-over conductor, "crosses-over" the cross-under conductor. The thickness of the dielectric build-up in the cross-over layer may exceed 70 microns.

A film resistor's electrical characteristics however, are intimately dependent on the thickness of the resistor paste applied to the substrate. Ideally, at the instant of ink or paste deposition of the resistor to the substrate, the screen to substrate distance should be zero. A large build-up in a cross-over layer will limit the minimum distance between the screen and the substrate. Consequently, when a resistor is to be printed near a dielectric build-up, erratic printing thickness results, with the printed resistor exhibiting electrical characteristics which are not within tolerance for the microcircuit design. The erratic printing thickness is further exacerbated when normal process variations vary the thickness of the dielectric build-up.

It would be advantageous to minimize the printed materials on the substrate when the resistor layers are being printed. The minimization of printed materials provides a more consistent screen to substrate separation, thereby allowing the printing of resistors that exhibit good electrical characteristics, and which are predictable and consistent with the microcircuit design.

Accordingly, it is the object of the present invention to provide a new and improved process of fabricating thick film hybrid microcircuits which provides thick film resistors having electrical characteristics consistent with the microcircuit design tolerances, in areas proximate a dielectric build-up.

DISCLOSURE OF THE INVENTION

The above and other objects, advantages, and capabilities are realized in a process for fabricating thick film hybrid microcircuits on a dielectric substrate. The process of the present invention comprises the steps of:

Printing a plurality of first conductor traces to the substrate and drying and firing the first conductor traces in a high temperature environment. The first conductor traces also include portions which will be cross-under conductors. A plurality of resistive elements are next printed on the substrate. The resistive elements are printed on the substrate intermediate selected pairs of conductor traces, electrically connecting each conductor trace of each selected pair of conductor traces to the other. The resistive elements are then dried and fired in a high temperature environment. A dielectric glaze is then printed over the resistive elements, and fired at the same temperature as the resistive elements.

Next, a dielectric layer is printed over selected portions of the first conductor traces, i.e., over the cross-under conductors. This dielectric layer is fired in an environment having a temperature lower than the environmental temperature used to fire the resistive elements. A second dielectric layer may be applied over the first layer to produce a thicker dielectric layer over the cross-under conductors.

A plurality of second conductor traces are next printed to the substrate and the dielectric layer, i.e. the cross-over conductor. The second conductor traces are dried and fired in an environment having a temperature lower than the temperature used to fire the second dielectric layer.

Finally, a dielectric glaze is printed over the cross-over conductors and dried and fired in an environment having a temperature equal to the environmental temperature used to fire the second dielectric layer.

BRIEF DESCRIPTION OF THE DRAWINGS

A better understanding of the invention may be had from the consideration of the following detailed description taken in conjunction with the single sheet of drawings included herewith, illustrating the process of fabricating thick film hybrid microcircuits in accordance with the present invention.

DESCRIPTION OF A PREFERRED EMBODIMENT

Turning now to the included drawings the process for making thick film hybrid microcircuits in accordance with the present invention includes the steps of:

Printing the microcircuit conductor traces 10 including the cross-under conductors on a ceramic substrate. The material used for printing the conductor and cross-under layer is a semi-precious metal such as DU-PONT ® 4474, palladium-silver (Pd-Ag). The printed conductors are dried and fired at a temperature of 850 degrees C., in air, for 10 minutes.

Next, the thick film resistors 12 are printed on the substrate. The resistive elements 12 are printed on the substrate intermediate selected pairs of conductor traces 10. The resistive elements 12, electrically connect each conductor trace 10 of each selected pair of conductor traces, to the other. Since only the conductors of step 10 have been previously printed, resistors of a uniform and controlled thickness can be screen printed on the substrate which exhibit predictable and consistent electrical characteristics required for the microcircuit design.

The material contemplated for use in the process of the present invention, is a ruthenium based resistor material such as DUPONT® 1400 or 1600 series thick film resistor paste. The printed thick film resistors are dried and fired at 850 degrees C., in air, for 10 minutes.

A ceramic metal (cermet) glaze 14 is next printed over the thick film resistors of step 12. The cermet glaze 14 provides mechanical protection to the printed thick film resistors, as well as, enhancing the resistors' stability during the printing and firing of the subsequent layers of the microcircuit. The cermet glaze 14 used in the present invention is a DUPONT® 9137, which is fired at 500 degrees C., in air, for 1 minute.

The dielectric build-up for the cross-over conductors is printed next. A first and a second dielectric layer, 16 and 18 respectively, is printed over the cross-under conductors 10. Unlike the cermet glaze of step 14, which is applied over the resistors, the first and second dielectric layers 16 and 18 are a low temperature curing polymer based encapsulant M-7000 ™, manufactured by Minico. The printing of two layers over the cross-under conductors minimizes the occurrence of pinholes which can develop shorts between the cross-under and cross-over conductor. The first and second dielectric layers 16 and 18 are each cured at 210 degrees C., in air, using an infrared heat source.

The cross-over conductors 20 are now printed on the substrate using a low firing temperature conductor such as DUPONT® 5005 or 5008 silver (Ag) conductor paste. This layer is fired at 90 degrees C., in air, for 2 minutes. The low firing requirements of this conductor minimizes the possibility of shifting of the ohmic values of the deposited thick film resistors of step 12. Thereby, making the production and control of the final circuit more predictable.

Finally, a glaze layer 22 of Minico M-7000 ™ polymer encapsulant is printed and cured over the cross-over conductors. This layer primarily provides mechanical protection to the cross-under/cross-over buildup.

It is useful to underscore some of the salient attributes of the subject invention.

First, as can be appreciated by those skilled in the art, the present invention minimizes the printed layers on the substrate when the thick film resistor layers are being printed. This minimization provides a more consistent screen to substrate separation, thereby, having a direct correlation to resistor thickness. Consequently, the electrical characteristics of the thick film resistors will be more predictable and constant.

Second, the use of low firing temperature polymer dielectric layers as well as the low firing temperature cross-over conductor layer, minimizes any shifts in the ohmic values of the printed thick film resistors during the printing of the layers subsequent to the resistor layer.

Furthermore, it will be obvious to those skilled in the art that numerous modifications to the present invention can be made without departing from the scope of the invention as defined by the appended claims. In this context, it should be recognized that the essence of the invention resides in a new and improved process of fabricating thick film hybrid microcircuits which provides thick film resistors having electrical characteristics consistent with the microcircuit design tolerances, in areas proximate a dielectric build-up.

What is claimed is:

1. A process for fabricating thick film hybrid microcircuits on a dielectric substrate comprising the steps of:

establishing a plurality of first conductor paths on said substrate by printing a semi-precious conductor material to selected areas of said substrate, and fixing said first conductor paths to said substrate by drying and firing said first conductor paths in a high temperature environment;

establishing a plurality of resistors on said substrate and selected pairs of said first conductor paths by printing a resistive material to selected areas of said substrate intermediate said selected pairs of first conductor paths, electrically connecting each conductor path of each selected pair of first conductor paths to the other and fixing said resistive material to said substrate and said selected pairs of first conductor paths by drying and firing in a high temperature environment;

printing a ceramic metal glaze over said resistors and fixing said ceramic metal glaze to said resistors by drying and firing in a high temperature environment;

printing a first dielectric layer over selected portions of said first conductor paths and fixing said first dielectric layer by drying and firing in an environment having a temperature lower than the environment temperature used to fix said resistors.

printing a second dielectric layer over said first dielectric layer and fixing said second dielectric layer by drying and firing in an environment having a temperature lower than the environment temperature used to fix said resistors;

depositing a plurality of second conductor paths on said substrate and on said second dielectric layer by printing a semi-precious conductor material to selected areas of said substrate and said second dielectric layer, and fixing said second conductor paths to said substrate by drying and firing in an environment having a temperature lower than the environment temperature used to fix said second dielectric substrate; and printing a polymer glaze over the portions of said second conductor paths which were printed over said second dielectric layer, and drying and fixing said polymer glaze to said second conductors by drying and firing in an environment having a temperature equal to the environment temperature used to fix said second dielectric substrate.

2. A process for fabricating thick film hybrid microcircuits on a dielectric substrate comprising the steps of:

printing a high temperature conductor material on selected areas of said substrate, and fixing said high temperature conductor to said substrate by drying and firing in a high temperature environment;

printing resistive means on selected areas of said high temperature conductor and, said substrate intermediate said selected areas of said high temperature conductor and fixing said resistive means to said substrate and high temperature conductor by drying and firing in a high temperature environment;

printing a high temperature dielectric over said resistive means, and fixing said high temperature dielectric to said resistive means by drying and firing in a high temperature environment;

printing a first dielectric layer over selected portions of said high temperature conductor material and fixing said first dielectric layer by drying and firing in an environment having a temperature lower than the environment temperature used to fix said resistive means;

printing a second dielectric layer over said first dielectric layer, and fixing said second dielectric layer by drying and firing in an environment having a temperature lower than the environment temperature used to fix said resistive means;

printing a low temperature conductor material on selected areas of said substrate and said second dielectric layer, and fixing said low temperature conductor material to said substrate by drying and firing in an environment having a temperature lower than the environment temperature used to fix said second dielectric; and printing a third dielectric layer over the portions of said low temperature conductor material which were printed over said second dielectric layer, and fixing said third dielectric layer by drying and firing in an environment having a temperature lower than the environment temperature used to fix said resistive means.

3. A process for fabricating thick film hybrid microcircuits on a dielectric substrate comprising the steps of:

printing a plurality of first conductor means to said substrate, and firing in a high temperature environment;

printing a plurality of resistive means on selected areas of said first conductor means and said substrate intermediate said selected areas of said first conductor means, and firing in a high temperature environment;

printing first dielectric means over said resistive means and firing in a high temperature environment;

printing at least a second dielectric means over selected portions of said first conductor means, and firing in an environment having a temperature lower than the environment temperature used to fire said resistive means;

printing second conductor means on said substrate and said second dielectric means, and firing in an environment having a temperature lower than the environment temperature used to fire said second dielectric means; and printing third dielectric means over the portions of said second conductor means which were printed over said second dielectric means, and firing in an environment having a temperature equal to the environment temperature used to fire said second dielectric means.

4. A process for fabricating thick film hybrid microcircuits on a dielectric substrate comprising the steps of:

establishing a plurality of first conductor paths on said substrate by printing a silver-palladium (Pd-Ag) based conductor material to selected areas of said substrate, and fixing said first conductor paths to said substrate by drying and firing said first conductor paths at 850 degrees C., in air, for 10 minutes.

establishing a plurality of resistors on said substrate and selected pairs of said first conductor paths by printing a ruthenium resistive material to selected areas of said substrate intermediate said selected pairs of first conductor paths, electrically connecting each conductor path of each selected pair of first conductor paths to the other and fixing said resistive material to said substrate and said selected pairs of first conductor paths by drying and firing said resistive material at 850 degrees C., in air for 10 minutes;

printing a ceramic metal glaze over said resistors, and fixing said ceramic metal glaze to said resistors by drying and firing said ceramic metal glaze at 850 degrees C., in air, for 1 minute;

printing a first polymer dielectric layer over selected portions of said first conductor paths, and fixing said first polymer dielectric layer by drying and firing at 210 degrees C., in air, for 2 minutes;

printing a second polymer dielectric layer over said first polymer dielectric layer, and fixing said second polymer dielectric layer by drying and firing in at 210 degrees C., in air, for 2 minutes;

establishing a plurality of second conductor paths on said substrate and on said second polymer dielectric layer by printing a silver (Ag) based conductor material to selected areas of said substrate and to said second polymer dielectric layer, and fixing said second conductor paths by drying and firing at 90 degrees C., in air, for 20 minutes; and printing a polymer glaze over the portions of said second conductor paths which were printed over said second polymer dielectric layer, and fixing said polymer glaze to said second conductors by drying and firing at 210 degrees C., in air, for 2 minutes.

* * * * *